United States Patent
Chae et al.

(10) Patent No.: US 10,756,059 B2
(45) Date of Patent: Aug. 25, 2020

(54) SEMICONDUCTOR CHIP INCLUDING A PLURALITY OF PADS

(71) Applicant: SAMSUNG ELECTRONICS CO., LTD., Suwon-si (KR)

(72) Inventors: Kwanyeob Chae, Hwaseong-si (KR); Sanghoon Joo, Osan-si (KR); Jong-Ryun Choi, Hwaseong-si (KR); Jin-Ho Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/157,642

(22) Filed: Oct. 11, 2018

(65) Prior Publication Data
US 2019/0043841 A1 Feb. 7, 2019

Related U.S. Application Data

(63) Continuation of application No. 15/277,339, filed on Sep. 27, 2016, now Pat. No. 10,115,706.

(30) Foreign Application Priority Data

Oct. 2, 2015 (KR) .................. 10-2015-0139167
Feb. 1, 2016 (KR) .................. 10-2016-0012408

(51) Int. Cl.
*H01L 25/065* (2006.01)
*H01L 23/50* (2006.01)
(Continued)

(52) U.S. Cl.
CPC .......... *H01L 25/0657* (2013.01); *H01L 23/50* (2013.01); *H01L 23/5286* (2013.01);
(Continued)

(58) Field of Classification Search
CPC ... H01L 25/06; H01L 25/065; H01L 25/0657; H01L 24/00; H01L 24/02; H01L 24/05;
(Continued)

(56) References Cited

U.S. PATENT DOCUMENTS 6,433,441 B1  8/2002  Niwa et al.
6,556,454 B1  4/2003  D'Amato et al.
(Continued)

FOREIGN PATENT DOCUMENTS

JP  2000-252363 A  9/2000

*Primary Examiner* — Monica D Harrison
(74) *Attorney, Agent, or Firm* — Sughrue Mion, PLLC

(57) ABSTRACT

A semiconductor chip including a plurality of input/output units includes: a plurality of additional pads disposed on a surface of the semiconductor chip, wherein the plurality of additional pads include at least one of a first additional pad to which a ground voltage is applied and a second additional pad to which a power supply voltage is applied; and a plurality of pads disposed on the surface of the semiconductor chip, wherein the plurality of pads include at least one of a first pad to which the ground voltage is applied and a second pad to which the power supply voltage is applied, and further include a third pad through which a signal is input and/or output. The at least one of the first additional pad and the second additional pad is disposed on an input/output unit where the third pad is disposed, among the plurality of input/output units.

20 Claims, 16 Drawing Sheets

(51) Int. Cl.
*H01L 23/58* (2006.01)
*H01L 23/60* (2006.01)
*H01L 23/00* (2006.01)
*H01L 23/528* (2006.01)
*H01L 23/522* (2006.01)

(52) U.S. Cl.
CPC ............ *H01L 23/585* (2013.01); *H01L 23/60* (2013.01); *H01L 24/00* (2013.01); *H01L 24/02* (2013.01); *H01L 23/5221* (2013.01); *H01L 24/05* (2013.01); *H01L 24/06* (2013.01); *H01L 24/14* (2013.01); *H01L 24/16* (2013.01); *H01L 2224/0233* (2013.01); *H01L 2224/0235* (2013.01); *H01L 2224/02375* (2013.01); *H01L 2224/02377* (2013.01); *H01L 2224/02381* (2013.01); *H01L 2224/0401* (2013.01); *H01L 2224/05552* (2013.01); *H01L 2224/06131* (2013.01); *H01L 2224/06135* (2013.01); *H01L 2224/14131* (2013.01); *H01L 2224/14135* (2013.01); *H01L 2224/16145* (2013.01); *H01L 2224/16227* (2013.01); *H01L 2225/06513* (2013.01); *H01L 2225/06555* (2013.01); *H01L 2924/00012* (2013.01)

(58) Field of Classification Search
CPC ......... H01L 24/06; H01L 24/14; H01L 24/16; H01L 23/52; H01L 23/528; H01L 23/5286; H01L 23/58; H01L 23/585; H01L 23/60
USPC .......................................................... 257/737
See application file for complete search history.

(56) References Cited

U.S. PATENT DOCUMENTS

| | | |
|---|---|---|
| 6,727,596 B2 | 4/2004 | Takabayashi et al. |
| 7,408,831 B2 | 8/2008 | Taniguchi et al. |
| 8,549,447 B2 | 10/2013 | Eisenstadt |
| 8,773,163 B1 | 7/2014 | Park et al. |
| 10,115,706 B2 * | 10/2018 | Chae ...................... H01L 24/00 |
| 2002/0130424 A1 | 9/2002 | Takabayashi et al. |
| 2007/0115747 A1 | 5/2007 | Taniguchi et al. |
| 2009/0166856 A1 | 7/2009 | Iwata |
| 2011/0260318 A1 | 10/2011 | Eisenstadt |

* cited by examiner

SEMICONDUCTOR CHIP INCLUDING A PLURALITY OF PADS

CROSS-REFERENCE TO RELATED APPLICATIONS

This is a continuation of U.S. application Ser. No. 15/277,339 filed Sep. 27, 2016, which claims priority from Korean Patent Application No. 10-2016-0012408, filed on Feb. 1, 2016, and Korean Patent Provisional Application No. 10-2015-0139167, filed on Oct. 2, 2015, in the Korean Intellectual Property Office, the disclosures of which are incorporated by reference in their entireties.

BACKGROUND

Apparatuses consistent with exemplary embodiments relate to semiconductor chips, and more particularly, to an arrangement of pads of a semiconductor chip that is mounted on a package substrate by a flip chip method.

A semiconductor chip may be mounted on a package substrate by a wire bonding method or a flip chip method. In a case where a semiconductor chip is mounted on the package substrate by a flip chip method, the semiconductor chip may include a plurality of pads to receive power and/or transmit and receive a signal. The plurality of pads may be disposed on a semiconductor chip.

It is very important to sufficiently supply power to a semiconductor chip to prevent an increase of a simultaneous switching noise (SSN) of a signal while the signal is transmitted and/or received. However, if the number of pads to which power is supplied to is increased, this may cause an increase of a chip size. On the other hand, if the number of pads to which power is supplied is reduced, this may cause an increase of the simultaneous switching noise (SSN). Thus, it is desirable to effectively dispose pads on the semiconductor chip so that power is sufficiently supplied to the semiconductor chip while a size of the semiconductor chip is not increased.

SUMMARY

According to an aspect of an exemplary embodiment, provided is a semiconductor chip including a plurality of input/output units, the semiconductor chip including: a plurality of additional pads disposed on a surface of the semiconductor chip, wherein the plurality of additional pads include at least one of a first additional pad to which a ground voltage is applied and a second additional pad to which a power supply voltage is applied; and a plurality of pads disposed on the surface of the semiconductor chip, wherein the plurality of pads include at least one of a first pad to which the ground voltage is applied and a second pad to which the power supply voltage is applied, and further include a third pad through which a signal is input and/or output, wherein the at least one of the first additional pad and the second additional pad is disposed on an input/output unit where the third pad is disposed, among the plurality of input/output units.

The plurality of additional pads may include the first additional pad, and the semiconductor chip may further include a first conductive ring disposed within the semiconductor chip and electrically connected to the first additional pad.

The plurality of pads may include the first pad, and the first pad may be electrically connected to the first conductive ring.

The plurality of additional pads may include the second additional pad, and the semiconductor chip may further include a second conductive ring disposed within the semiconductor chip and electrically connected to the second additional pad.

The plurality of pads may include the second pad, and the second pad may be electrically connected to the second conductive ring.

The semiconductor chip may further include an input/output buffer located corresponding to the input/output unit where the third pad is disposed, among the plurality of input/output units, and configured to receive and/or output the signal.

The semiconductor chip may further include at least one of: a first bump area connected to at least one of the first additional pad and the first pad through a first conductive line; a second bump area connected to at least one of the second additional pad and the second pad through a second conductive line; and a third bump area connected to the third pad through a third conductive line.

The semiconductor chip may be mounted on a package substrate by a flip chip method.

According to an aspect of another exemplary embodiment, provided is a semiconductor chip including a plurality of input/output units, the semiconductor chip including: a plurality of pads disposed on a surface of the semiconductor chip, wherein the plurality of pads include at least one of a first pad, disposed on a first row and configured to receive a ground voltage, and a second pad, disposed on a second row and configured to receive a power supply voltage; and a plurality of additional pads disposed on the surface of the semiconductor chip, wherein the plurality of additional pads include at least one of a first additional pad to which the ground voltage is applied and a second additional pad to which the power supply voltage is applied, wherein, when the plurality of pads include the second pad and the plurality of additional pads include the first additional pad, at least one of the first additional pad is disposed on an input/output unit where at least one of the second pad is disposed, among the plurality of input/output units, and wherein, when the plurality of pads include the first pad and the plurality of additional pads include the second additional pad, at least one of the second additional pad is disposed on an input/output unit where at least one of the first pad is disposed, among the plurality of input/output units.

The plurality of pads may include the first pad, and the semiconductor chip may further include a first conductive ring disposed within the semiconductor chip and electrically connected to the first pad.

The plurality of additional pads may include the first additional pad, and the first additional pad may be electrically connected to the first conductive ring.

The plurality of pads may include the second pad, and the semiconductor chip may further include a second conductive ring disposed within the semiconductor chip and electrically connected to the second pad.

The plurality of additional pads may include the second additional pad, and the second additional pad may be electrically connected to the second conductive ring.

The plurality of pads may include a third pad disposed on a third row and configured to receive and/or output a signal, and the semiconductor chip may further include an input/output buffer disposed within the semiconductor chip and configured to receive and/or output the signal, the input/output buffer being located corresponding to an input/output unit where the third pad is disposed, among the plurality of input/output units.

The semiconductor chip may further include at least one of: a first bump area connected to at least one of the first additional pad and the first pad through a first conductive line; a second bump area connected to at least one of the second additional pad and the second pad through a second conductive line; and a third bump area connected to a third pad through a third conductive line, the third pad disposed on a third row and configured to receive and/or output a signal.

The first conductive ring may be positioned to have a minimum distance from the first pad.

According to an aspect of still another embodiment, provided is a semiconductor chip including: a plurality of input/output units, wherein at least one input/output unit among the plurality of input/output units includes at least two from among: a first pad to which a ground voltage is applied; a second pad to which a power supply voltage is applied; and a third pad through which a signal is input and/or output.

In the at least one input/output unit, the at least two from among the first pad, the second pad, and the third pad may be disposed on different rows on a surface of the semiconductor chip.

The semiconductor chip may further include a plurality of pads disposed on the plurality of input/output units, wherein the plurality of pads include a plurality of first pads that are disposed on different rows on a surface of the semiconductor chip and/or a plurality of second pads that are disposed on different rows on the surface of the semiconductor chip.

The semiconductor chip may further include a conductive ring disposed within the semiconductor chip and electrically connected to the plurality of first pads and/or the plurality of second pads that are disposed on the different rows on the surface of the semiconductor.

BRIEF DESCRIPTION OF THE FIGURES

The above and/or other aspects will be more apparent by describing certain example embodiments with reference to the accompanying drawings.

DETAILED DESCRIPTION

Figure 1:
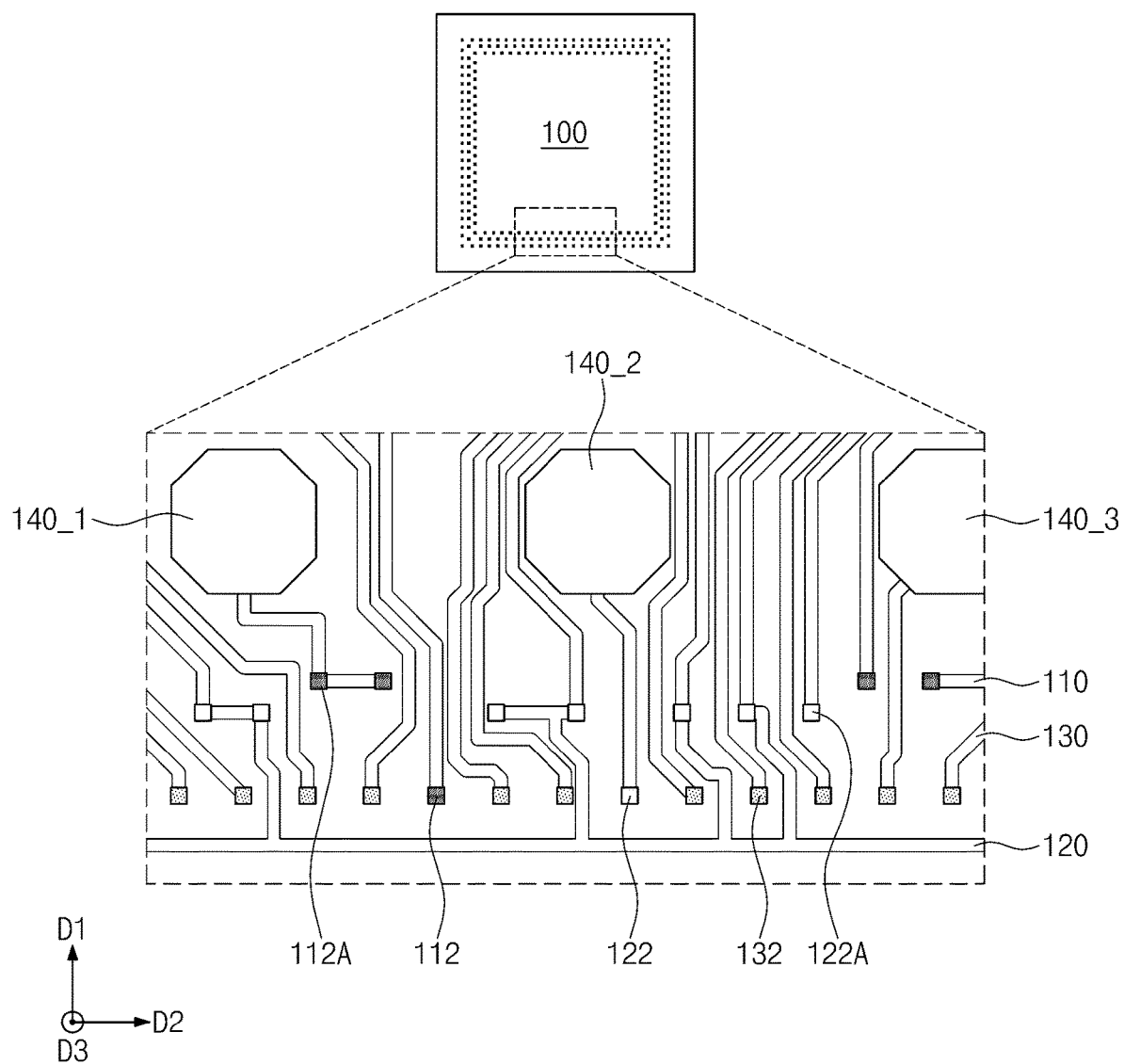
FIG. 1 is a top plan view of a semiconductor chip in accordance with example embodiments.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," ""on" versus "directly on") As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Expressions such as "at least one of" when preceding a list of elements, modify the entire list of elements and do not modify the individual elements of the list.

FIG. 1 is a top plan view of a semiconductor chip 100 in accordance with example embodiments. The semiconductor chip 100 may be mounted on a package substrate or another semiconductor chip by a flip chip method. A plurality of pads may be provided on one side of the semiconductor chip 100 and the plurality of pads may include first pads 112 to which a ground voltage is supplied, second pads 122 to which a power supply voltage is supplied, and third pads 132 to which a signal is input or from which a signal is output. For example, a signal being input or output through the third pads 132 may be a data signal, or a control signal that controls the semiconductor chip 100.

The first pads 112 may be connected to at least one first bump area 140_1 through first conductive lines 110. Although one first bump area 140_1 is illustrated in FIG. 1, a plurality of first bump areas may be further provided. The second pads 122 may be connected to at least one second bump area 140_2 through second conductive lines 120. Although one second bump area 140_2 is illustrated in FIG. 1, a plurality of second bump areas may be further provided. The third pads 132 may be connected to at least one third bump area 140_3 through third conductive lines 130. Although one third bump area 140_3 is illustrated in FIG. 1, a plurality of third bump areas may be further provided.

A first bump (not illustrated) may be connected to the first bump area 140_1. For example, the first bump may connect, to the semiconductor chip 100, another semiconductor chip (not illustrated) or a package substrate (not illustrated) that is connected to the semiconductor chip 100 by a flip chip method. That is, a ground voltage provided through the first bump area 140_1 may be transmitted to the first pads 112 through the first conductive lines 110.

A second bump (not illustrated) may be connected to the second bump area 140_2. For example, the second bump may connect, to the semiconductor chip 100, another semiconductor chip (not illustrated) or a package substrate (not illustrated) that is connected to the semiconductor chip 100 by a flip chip method. That is, a ground voltage provided through the second bump area 140_2 may be transmitted to the second pads 122 through the second conductive lines 120.

A third bump (not illustrated) may be connected to the third bump area 140_3. For example, the third bump may connect, to the semiconductor chip 100, another semiconductor chip (not illustrated) or a package substrate (not illustrated) that is connected to the semiconductor chip 100 by a flip chip method. That is, a ground voltage provided through the third bump area 140_3 may be transmitted to the third pads 132 through the third conductive lines 130.

A connection relation between the bump areas 140_1, 140_2, 140_3 and the conductive lines 110, 120, 130 illustrated in FIG. 1 is only illustrative and is not limited thereto. An example method of arranging the first through third pads 112, 122, 132 will be described in detail with reference to the drawings below.

Figure 2:
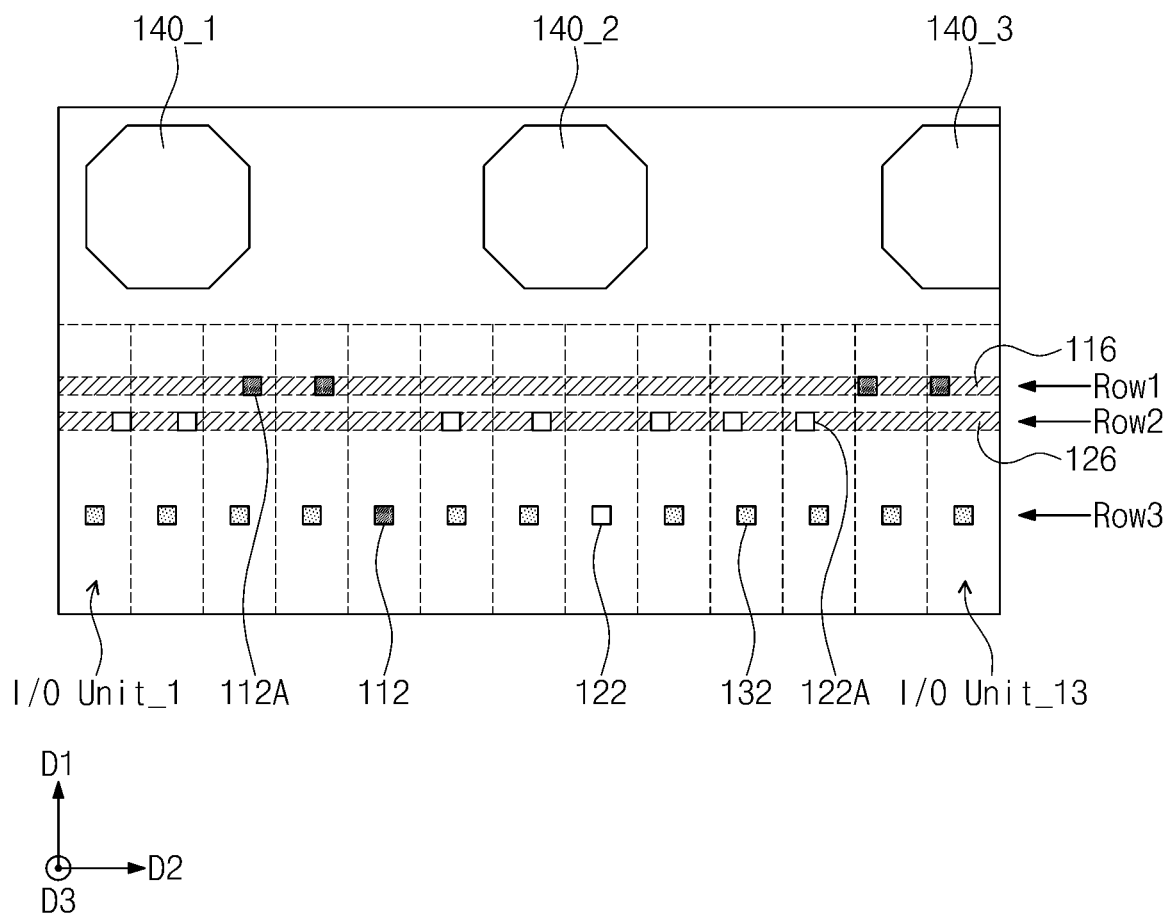
FIG. 2 is a drawing illustrating an enlarged area of FIG. 1.

FIG. 2 is a drawing illustrating an enlarged area of FIG. 1. For brevity of description, conductive lines connecting the bump areas 140_1, 140 2, 140_3 and the pads 112, 122, 132 are omitted in FIG. 2. Ring type conductive rings 116 and 126 disposed inside the semiconductor chip 100 are illustrated as an example.

Referring to FIG. 2, the semiconductor chip 100 may include a plurality of input/output units. Thirteen input/output units are illustrated in FIG. 2 as an illustration, however, exemplary embodiments are not limited thereto. Each input/output unit may include at least one pad. For example, a first input/output unit (I/O unit_1) is illustrated to include one second pad 122 and one third pad 132. In particular, an input/output unit including the third pad 132 through which a signal is input or output among the input/output units (I/O unit) may further include an input/output buffer (not illustrated) within the underlying semiconductor chip 100 that receives or outputs the signal. A ground voltage supplied through the first pads 112 and first additional pads 112A and a power supply voltage supplied through the second pads 122 and second additional pads 122A are supplied to the input/output buffer to prevent an increase of the simultaneous switching noise (SSN).

The first pads 112 may be disposed along a third row Row3 which is parallel to a second direction D2. The first additional pads 112A may be disposed along a first row Row1 which is parallel to the second direction D2. The second pads 122 may also be disposed along the third row Row3 which is parallel to the second direction D2. The second additional pads 122A may be disposed along a second row Row2 which is parallel to the second direction D2. The third pads 132 may be disposed along the third row Row3.

Although the first pad 112, the second pad 122 and the third pad 132 are illustrated to be disposed along the same row (e.g., Row3), the first pad 112, the second pad 122 and the third pad 132 may not be disposed in the same row as long as the first pad 112 and the second pad 122 are disposed on rows different from rows on which the first additional pad 112A and the second additional pad 122A are disposed.

The first conductive ring 116 may be disposed inside the semiconductor chip 100 under the first row Row1. That is, the first conductive ring 116 may extend along the first row Row1. Although only a part of the first conductive ring 116 is illustrated in FIG. 2, the first conductive ring 116 may be disposed to form a closed curve inside the semiconductor chip 100. The first conductive ring 116 may be connected to the first pad 112 and the first additional pad 112A through internal interconnection lines (not illustrated).

The second conductive ring 126 may be disposed inside the semiconductor chip 100 under the second row Row2. That is, the second conductive ring 116 may extend along the second row Row2. Although only a part of the second conductive ring 126 is illustrated in FIG. 2, the second conductive ring 126 may be disposed to form a closed curve inside the semiconductor chip 100. The second conductive ring 126 may be connected to the second pad 122 and the second additional pad 122A through internal interconnection lines (not illustrated).

According to example embodiments, an input/output unit including the third pad 132 to receive a signal from the outside may include the first pad 112 and/or the second pad 122. In this case, the first pad 112 and the second pad 122 may be disposed on a row different from a row along which the third pad 132 is disposed. That is, at least two pads may be provided to a single input/output unit and in this case, at least two pads may be disposed along a first direction D1.

To prevent a short that may occur between the two conductive rings 116 and 126 connected to the pads, a direction along which the at least two pads are disposed on the single input/output unit may not exactly coincide with the first direction D1. According to example embodiments, instead of providing a separate input/output unit to supply a ground voltage and a power supply voltage, the first additional pad 112A and the second additional pad 122A may be disposed in an input/output unit in which the third pad 132 is already disposed. As a result, a ground voltage and a power supply voltage may be stably supplied to an input/output unit without increasing the number of a pad to which a ground voltage and a power supply voltage are supplied and a chip size may be reduced.

Figure 3:
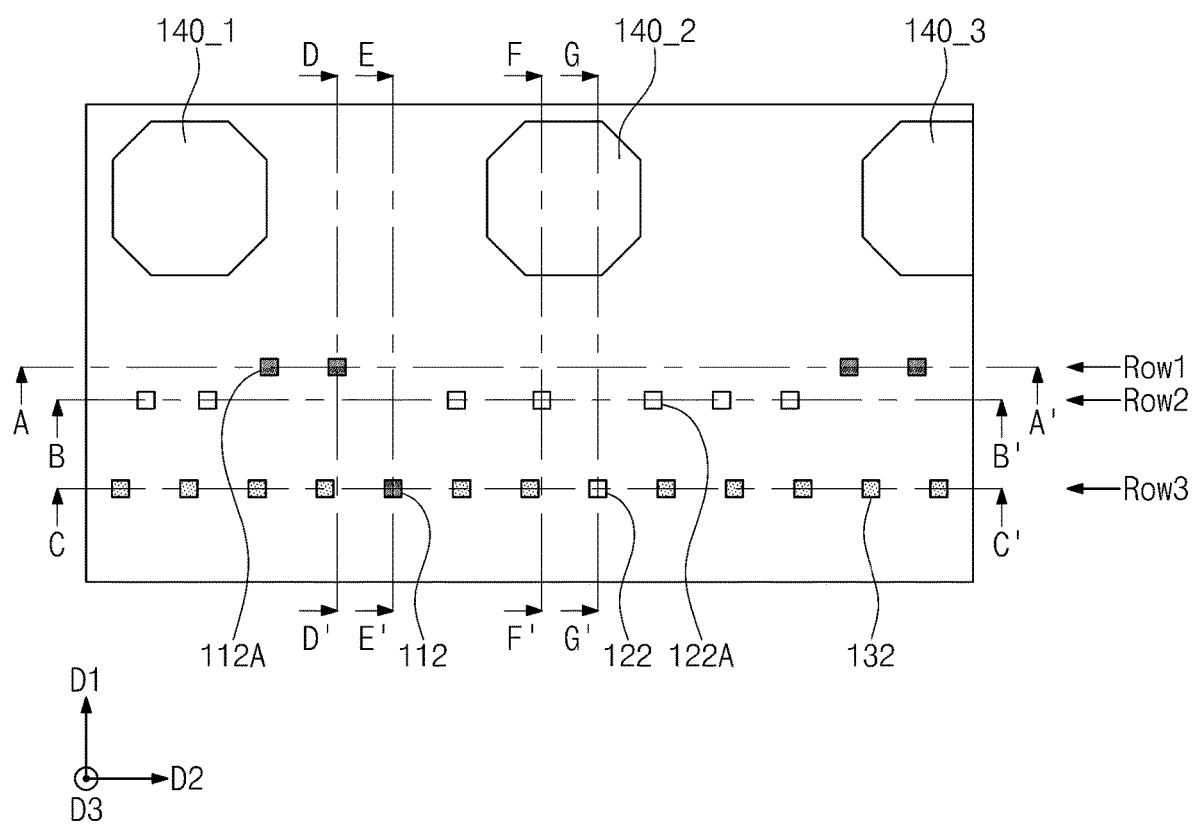
FIG. 3 is a top plan view illustrating a part of a semiconductor chip in accordance with example embodiments.
Figure 4A:
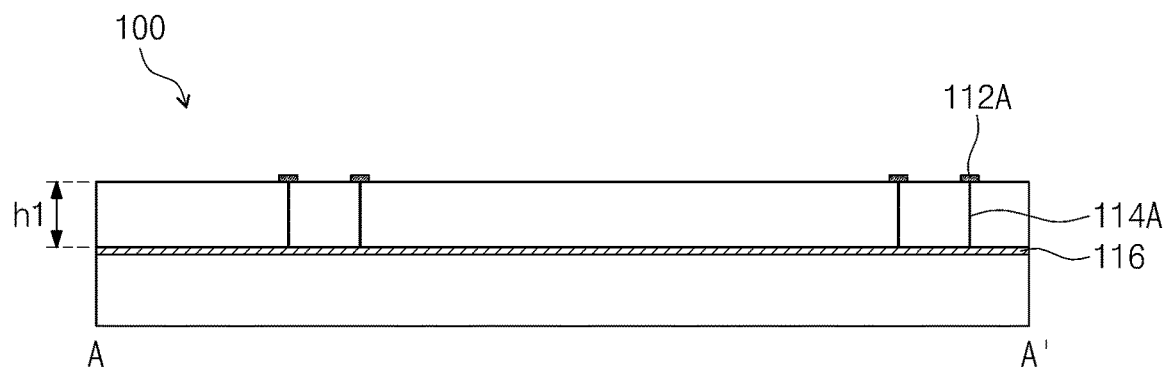
FIG. 4A is a cross-sectional view taken along the line A-A' of FIG. 3.
Figure 4B:
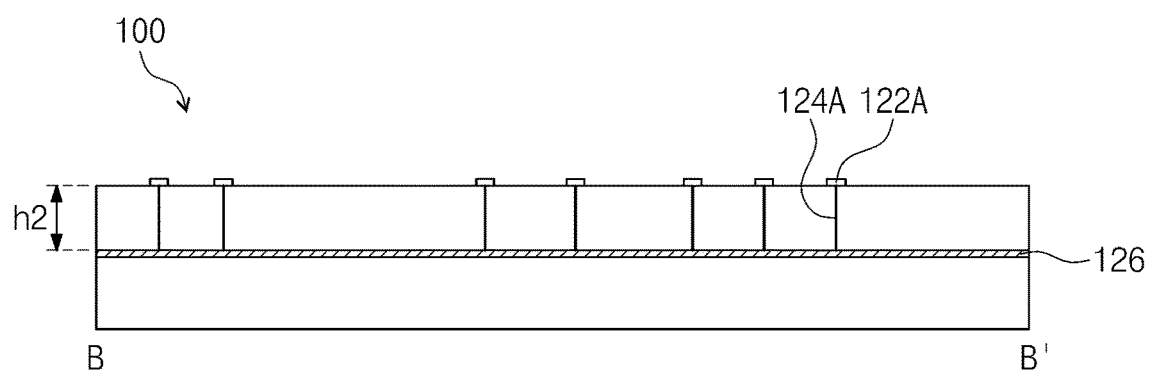
FIG. 4B is a cross-sectional view taken along the line B-B' of FIG. 3.
Figure 4C:
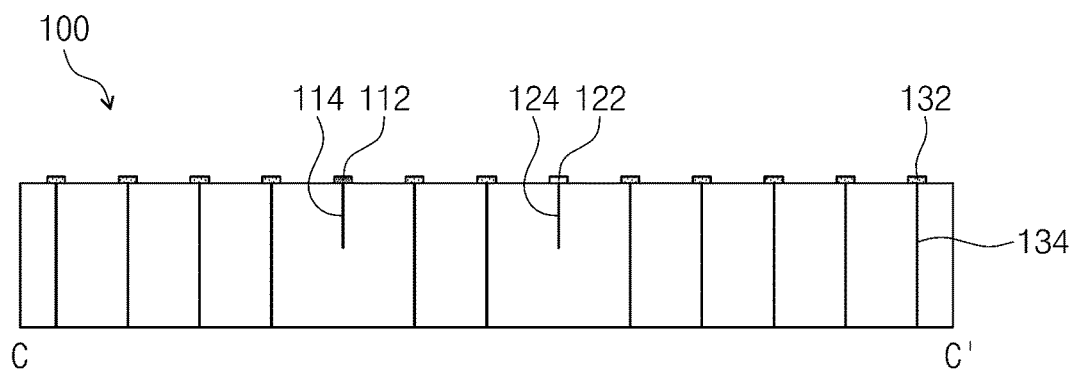
FIG. 4C is a cross-sectional view taken along the line C-C' of FIG. 3.
Figure 5A:
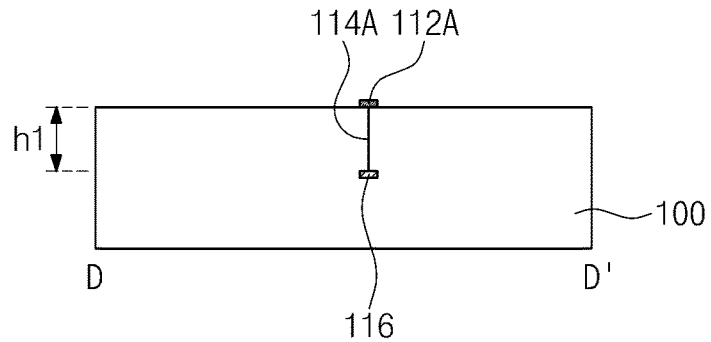
FIG. 5A is a cross-sectional view taken along the line D-D' of FIG. 3.
Figure 5B:
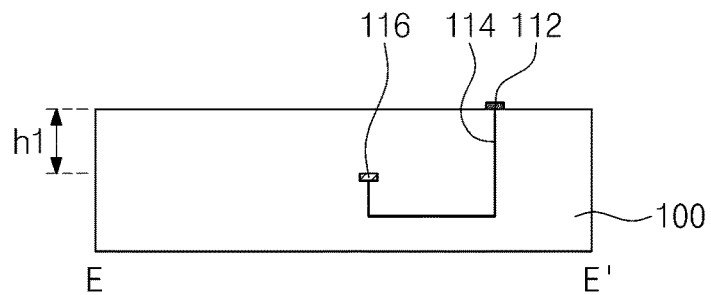
FIG. 5B is a cross-sectional view taken along the line E-E' of FIG. 3.
Figure 5C:
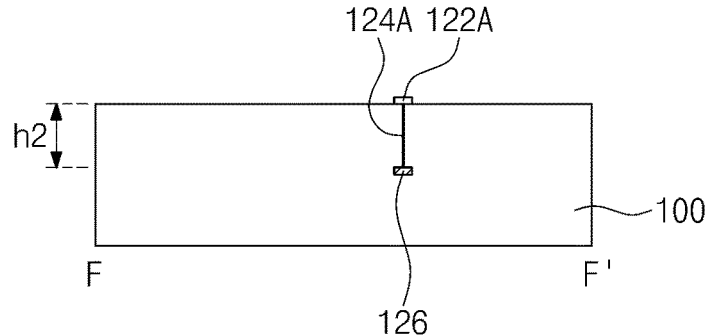
FIG. 5C is a cross-sectional view taken along the line F-F' of FIG. 3.
Figure 5D:
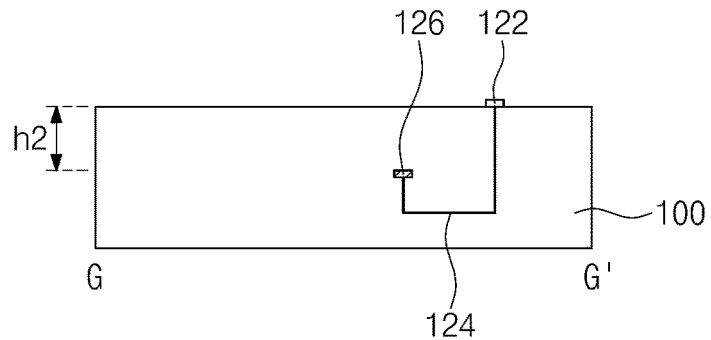
FIG. 5D is a cross-sectional view taken along the line G-G' of FIG. 3.

FIG. 3 is a top plan view illustrating a part of a semiconductor chip 100 in accordance with example embodiments. FIG. 4A is a cross-sectional view taken along the line A-N of FIG. 3. FIG. 4B is a cross-sectional view taken along the line B-B' of FIG. 3. FIG. 4C is a cross-sectional view taken along the line C-C' of FIG. 3. FIG. 5A is a cross-sectional view taken along the line D-D' of FIG. 3. FIG. 5B is a cross-sectional view taken along the line E-E' of FIG. 3. FIG. 5C is a cross-sectional view taken along the line F-F' of FIG. 3. FIG. 5D is a cross-sectional view taken along the line G-G' of FIG. 3.

Referring to FIGS. 3 through 5D, first additional pads 112A may be disposed along a first row Row1. A first conductive ring 116 may be disposed inside the semiconductor chip 100 under first additional pads 112A. The first additional pads 112A may be connected to the first conductive ring 116 through first additional internal interconnection lines 114A. The first conductive ring 116 may be disposed inside the semiconductor chip 100 at a depth of h1. As illustrated in FIG. 4A, the first additional pads 112A may be connected to the first conductive ring 116 to have a minimum distance therebetween. That is, each of the first additional pads 112A may be connected to the first conductive ring 116 to have a distance of h1 therebetween.

Second additional pads 122A may be disposed along a second row Row2. A second conductive ring 126 may be disposed inside the semiconductor chip 100 under the second additional pads 122A. The second additional pads 122A may be connected to the second conductive ring 126 through second additional internal interconnection lines 124A. The second conductive ring 126 may be disposed inside the semiconductor chip 100 at a depth of h2. As illustrated in FIG. 4B, the second additional pads 122A may be connected to the second conductive ring 126 to have a minimum distance therebetween. That is, each of the second additional pads 122A may be connected to the second conductive ring 126 to have a distance of h2 therebetween. For example, a value of h1 may be the same as a value of h2 or may be different from the value of h2.

Third pads 132 may be disposed along a third row Row3. Third internal interconnection lines 134 may connect the third pads 132 to a logical circuit (not illustrated), and a signal received through the third pads 132 may be transmitted to the logical circuit through the third internal interconnection lines 134. Although the third internal interconnection lines 134 are illustrated to penetrate the semiconductor chip 100 in FIG. 4C, this is for brevity of description and the third internal interconnection lines 134 may be connected to the logical circuit disposed inside the semiconductor chip 100.

The first pad 112 and the second pad 122 may be disposed along the third row Row3. A first internal interconnection line 114 may connect the first pad 112 to the first conductive ring 116. To prevent a short that may occur between the first internal interconnection line 114 and the second conductive ring 126, the first internal interconnection line 114 may be disposed in a shape of "U", as illustrated in FIG. 5B. A second internal interconnection line 124 may connect the second pad 122 to the second conductive ring 126. To prevent a short that may occur between the second internal interconnection line 124 and the first conductive ring 116, the second internal interconnection line 124 may be disposed in the shape of "U", as illustrated in FIG. 5D.

Figure 6:
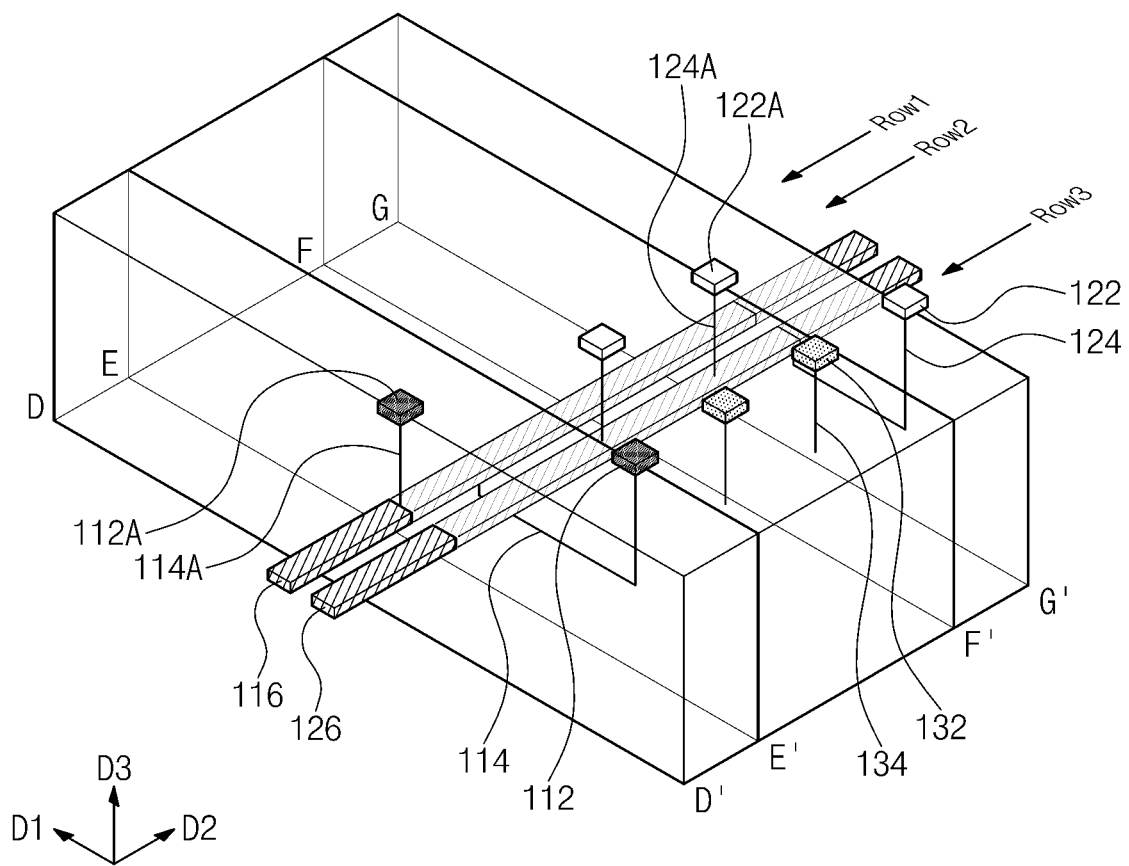
FIG. 6 is a drawing illustrating a part of FIG. 3 in three dimensions.

FIG. 6 is a drawing illustrating a part of FIG. 3 in three dimensions.

Referring to FIG. 6, the first additional pad 112A is disposed on the first row Row1 and the first conductive ring 116 is disposed inside the semiconductor chip 100 under the first additional pad 112A. The first additional pad 112A is connected to the first conductive ring 116 through the first additional internal interconnection line 114A. For example, the first additional pad 112A may be connected to the first conductive ring 116 to have a minimum distance therebetween. The first pad 112 is disposed on the third row Row3. The first pad 112 is connected to the first conductive ring 116 by the first internal interconnection line 114 having a U" shape to prevent a short that may occur between the first conductive ring 116 and the second conductive ring 126. However, this is only an example, and a shape of the first internal interconnection line 114 is not limited to a "U" shape and may have various shapes that may prevent a short between the first conductive ring 116 and the second conductive ring 126.

The second additional pad 122A is disposed on the second row Row2 and the second conductive ring 126 is disposed inside the semiconductor chip 100 under the second additional pad 122A. The second additional pad 122A is connected to the second conductive ring 126 through the second additional internal interconnection line 124A. For example, the second additional pad 122A may be connected to the second conductive ring 126 to have a minimum distance therebetween. The second pad 122 is disposed on the third row Row3. The second pad 122 is connected to the second conductive ring 126 by the second internal interconnection line 124 having a "U" shape to prevent a short that may occur between the first conductive ring 116 and the second conductive ring 126. However, this is only an example, and a shape of the second internal interconnection line 124 is not limited to a "U" shape and may have various shapes that may prevent a short.

As described above, the first additional pad 112A and the first pad 112 that are disposed on the first row Row1 and the third row Row3, respectively, may be connected to the first conductive ring 116, and the second additional pad 122A and the second pad 122 that are disposed on the second row Row2 and the third row Row3, respectively, may be connected to the second conductive ring 126. The first conductive ring 116 and the second conducive ring 126 may be connected to an electrostatic discharge circuit (ESD) circuit (not illustrated) disposed inside the semiconductor chip 100. The ESD circuit may be connected to a logical circuit (not illustrated) disposed inside the semiconductor chip 100 to stably supply power to the logical circuit. The third pads 132 may be connected to the logical circuit disposed inside the semiconductor chip 100 through the third internal interconnection lines 134.

According to the example embodiments, instead of providing a separate input/output unit to supply a ground voltage and a power supply voltage, the first additional pad 112A and/or the second additional pad 122A may be disposed in an input/output unit in which the third pad 132 is already disposed. In this case, the first additional pad 112A and/or the second additional pad 122A are disposed on the first row Row1 and/or the second row Row2 of the input/output unit in which the third pad is disposed. Thus, according to example embodiments, since a ground voltage and a power supply voltage can be sufficiently supplied without increasing the number of pads for supplying the ground voltage and the power supply voltage, an SSN of a signal being input through the third pad 132 may be reduced. Additionally, according to example embodiments, a separate input/output unit is not included to supply the ground voltage and the power supply voltage, a chip size may be reduced.

Figure 7:
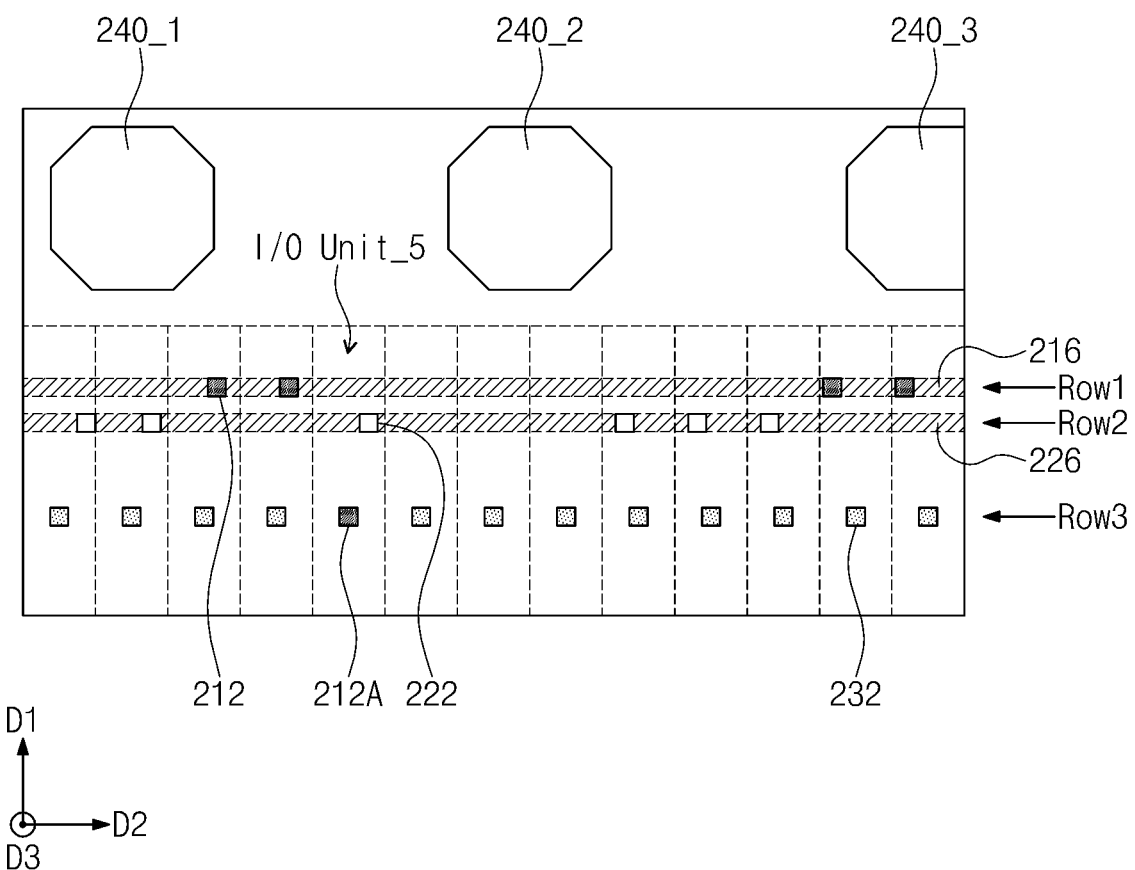
FIG. 7 is a drawing illustrating a part of a semiconductor chip in accordance with other example embodiments.

FIG. 7 is a drawing illustrating a part of a semiconductor chip in accordance with other example embodiments. As described above, a ground voltage may be supplied through the first pads 212, a power supply voltage may be supplied through the second pads 222, and signals may be provided through the third pads 232. For brevity of description, conductive lines connecting the bump areas 240_1, 240_2, 240_3 and the pads 212, 212, 232 are omitted. The conductive rings 216 and 226 of a ring type being disposed inside the semiconductor chip are illustrated as an example.

Referring to FIG. 7, the semiconductor chip may include a plurality of input/output unit (I/O unit). Thirteen input/output units are illustrated in FIG. 7 as an illustration, however, exemplary embodiments are not limited thereto. Each input/output unit may include at least one pad. For example, a fifth input/output unit (I/O unit_5) may include one first additional pad 212A and one second pad 222. An input/output unit including the third pad 232 through which a signal is input and/or output among the input/output units (I/O units) may further include an input/output buffer (not illustrated) inside the underlying semiconductor chip.

The first pads 212 may be disposed along the first row Row1 parallel to the second direction D2. The second pads 222 may be disposed along the second row Row2 parallel to the second direction D2. The third pads 232 may be disposed along the third row Row3 parallel to the second direction D2. The first additional pad 212A may be disposed along the third row Row3 along which the third pads 232 are disposed. However, the first additional pad 212A may not be disposed on the third row Row3 as long as the first additional pad 212A is disposed on a row different from the first row Row1 and the second row Row2.

The first conductive ring 216 may be disposed inside the semiconductor chip under the first row Row1. That is, the first conductive ring 216 may extend along the first row Row1. Although only a part of the first conductive ring 216 is illustrated in FIG. 7, the first conductive ring 216 may be disposed to form a closed curve inside the semiconductor chip. The first conductive ring 216 may be connected to the first pads 212 through internal interconnection lines (not illustrated).

The second conductive ring 226 may be disposed inside the semiconductor chip under the second row Row2. That is, the second conductive ring 226 may extend along the second row Row2. Similarly, although only a part of the second conductive ring 226 is illustrated in FIG. 7, the second conductive ring 226 may be disposed to form a closed curve inside the semiconductor chip. The second conductive ring 226 may be connected to the second pads 222 through internal interconnection lines (not illustrated).

According to example embodiments, instead of providing a separate input/output unit to include pads that receive a ground voltage, a pad that receives a ground voltage may be disposed in an input/output unit in which a pad that receives a power supply voltage is disposed. For example, referring to FIG. 7, the first additional pad 212A is disposed in the fifth input/output unit (I/O Unit_5) separately provided to receive a power supply voltage. In this case, instead of disposing a pad in a separate input/output unit to receive a ground voltage, the first additional pad 212A may be disposed inside the fifth input/output unit (I/O Unit_5). An SSN of a signal being input through the third pad 232 may be reduced by disposing the first additional pad 212A and the second pad 222 in one input/output unit. Also, a size of the semiconductor chip may be reduced.

Figure 8:
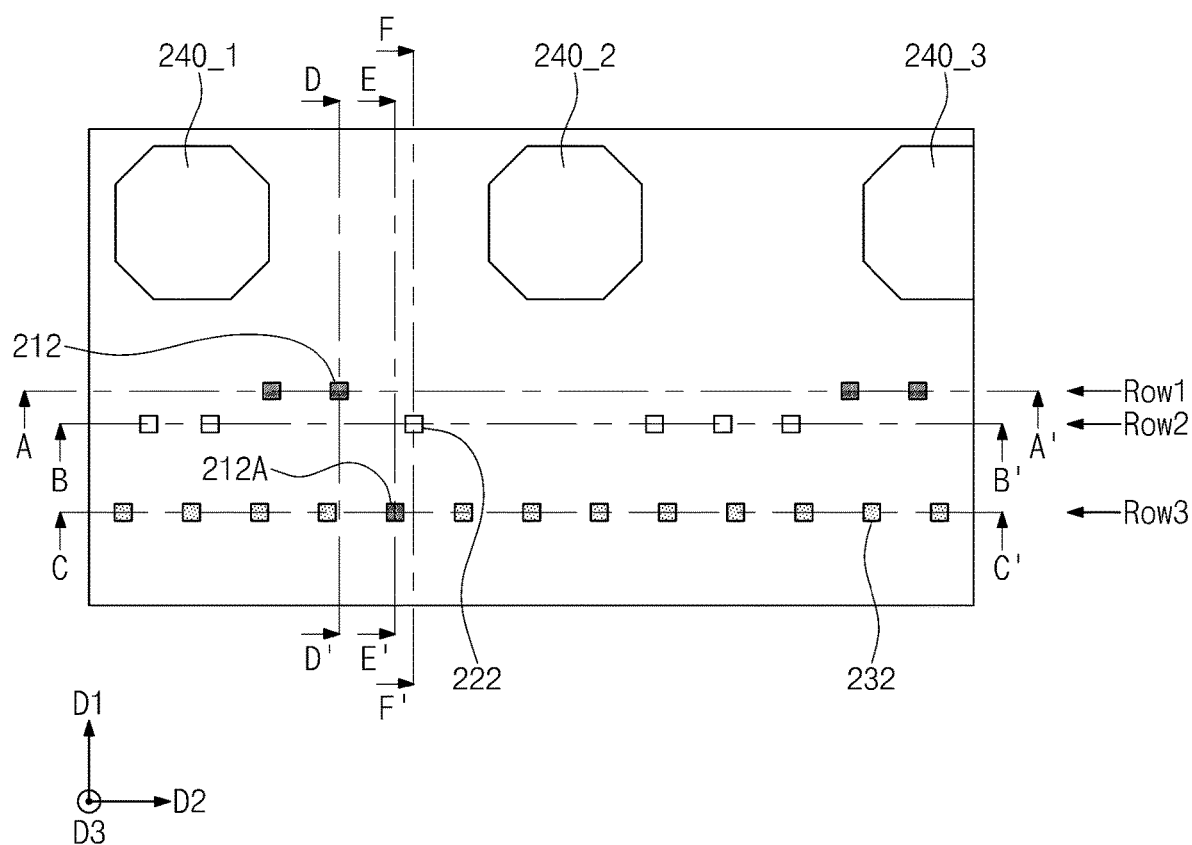
FIG. 8 is a top plan view illustrating a part of a semiconductor chip in accordance with example embodiments.
Figure 9A:
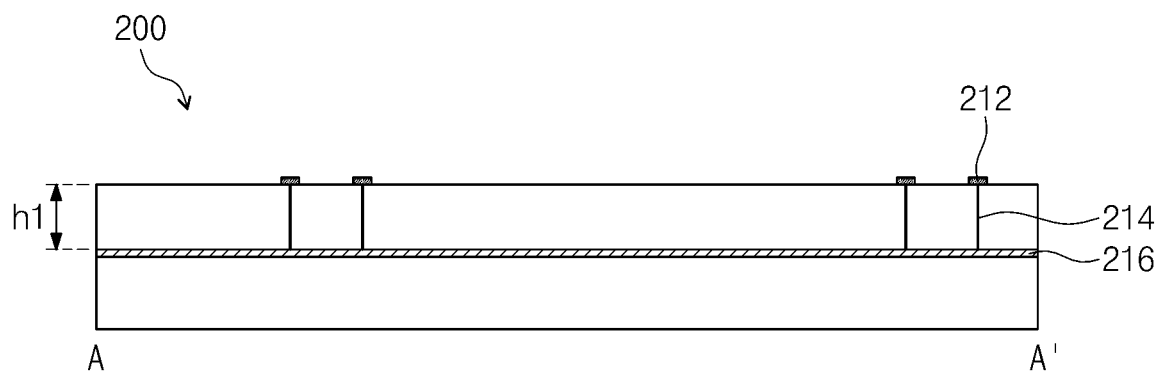
FIG. 9A is a cross-sectional view taken along the line A-A' of FIG. 8.
Figure 9B:
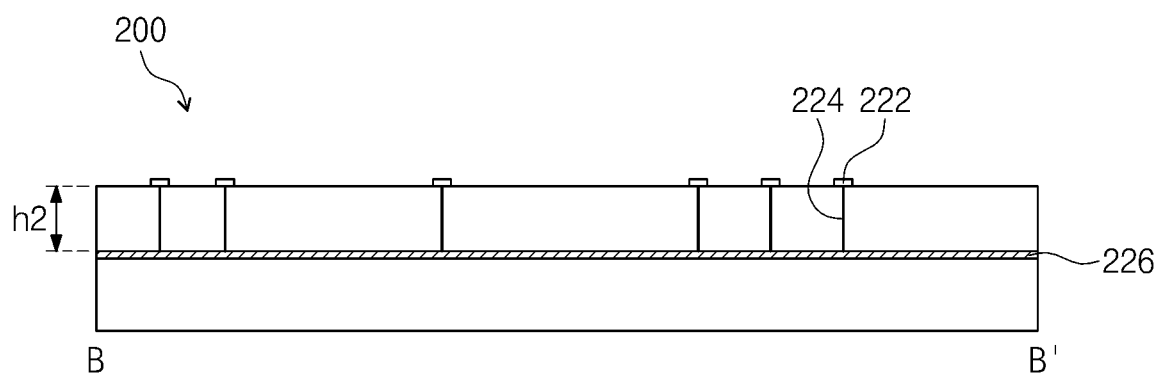
FIG. 9B is a cross-sectional view taken along the line B-B' of FIG. 8.
Figure 9C:
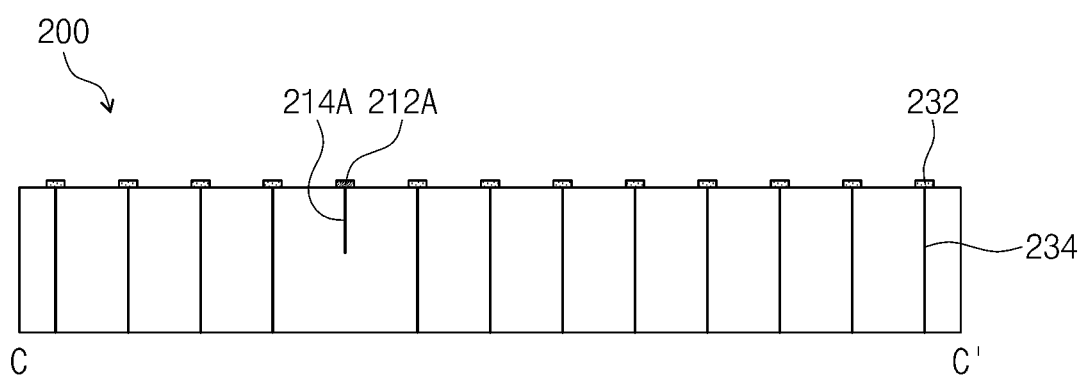
FIG. 9C is a cross-sectional view taken along the line C-C' of FIG. 8.
Figure 10A:
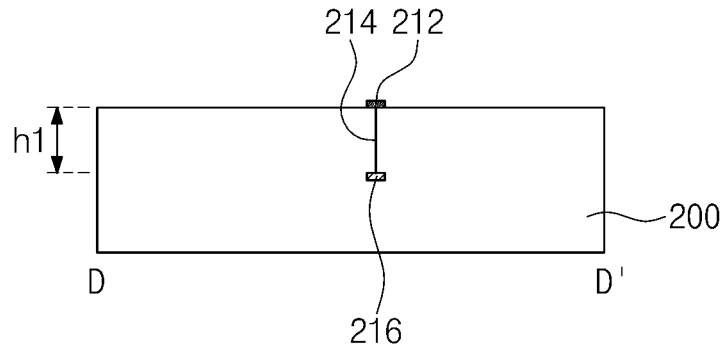
FIG. 10A is a cross-sectional view taken along the line D-D' of FIG. 8.
Figure 10B:
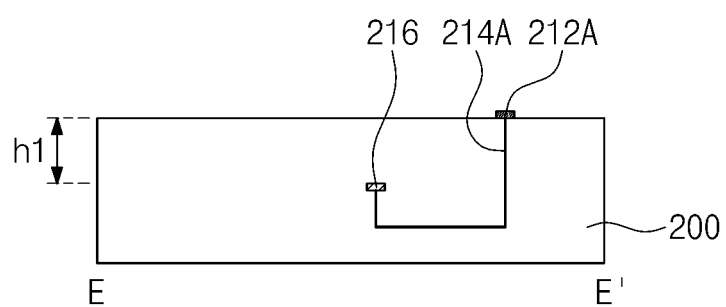
FIG. 10B is a cross-sectional view taken along the line E-E' of FIG. 8.
Figure 10C:
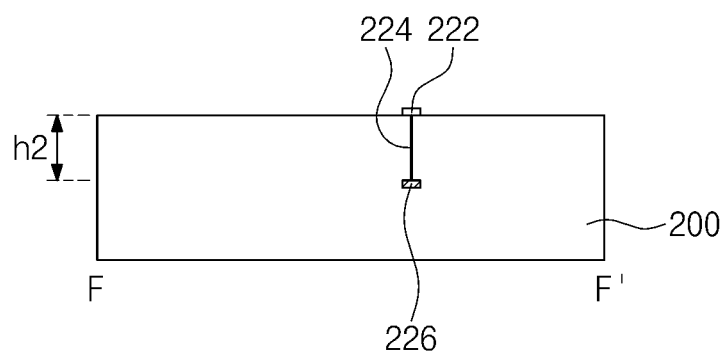
FIG. 10C is a cross-sectional view taken along the line F-F' of FIG. 8.

FIG. 8 is a top plan view illustrating a part of a semiconductor chip in accordance with example embodiments. FIG. 9A is a cross-sectional view taken along the line A-N of FIG. 8. FIG. 9B is a cross-sectional view taken along the line B-B' of FIG. 8. FIG. 9C is a cross-sectional view taken along the line C-C' of FIG. 8. FIG. 10A is a cross-sectional view taken along the line D-D' of FIG. 8. FIG. 10B is a cross-sectional view taken along the line E-E' of FIG. 8. FIG. 10C is a cross-sectional view taken along the line F-F' of FIG. 8.

Referring to FIGS. 8 through 10C, first pads 212 may be disposed along a first row Row1. A first conductive ring 216 may be disposed inside a semiconductor chip 200 under the first pads 212. The first pads 212 may be connected to the first conductive ring 216 through first internal interconnection lines 214. The first conductive ring 216 may be disposed inside the semiconductor chip 200 at a depth of h1. As illustrated in FIG. 9A, the first pads 212 may be connected to the first conductive ring 216 to have a minimum distance therebetween. That is, each of the first pads 212 may be connected to the first conductive ring 216 to have a length of h1 therebetween.

Some of the first pads (or first additional pads 212A) may be disposed along a third row Row3. A first additional internal interconnection line 214A may connect the first additional pad 212A to the first conductive ring 216. The first additional internal interconnection line 214A, as illustrated in FIG. 10B, may be disposed in the form of a "U" character.

Second pads 222 may be disposed along a second row Row2. A second conductive ring 226 may be disposed inside the semiconductor chip 200 under the second pads 222. The second pads 222 may be connected to the second conductive ring 226 through second internal interconnection lines 224. The second conductive ring 226 may be disposed inside the semiconductor chip 200 at a depth of h2. As illustrated in FIG. 9B, the second pads 222 may be connected to the second conductive ring 226 to have a minimum distance therebetween. That is, each of the second pads 222 may be connected to the second conductive ring 226 to have a length of h2 therebetween. A value of h1 and a value of h2 may be the same or different from each other.

Third pads 232 may be disposed along a third row Row3. Third internal interconnection lines (not illustrated) may connect the third pads 232 to a logical circuit (not illustrated) and a signal inputted through the third pads 232 may be transmitted to the logical circuit through the third internal interconnection lines.

Figure 11:
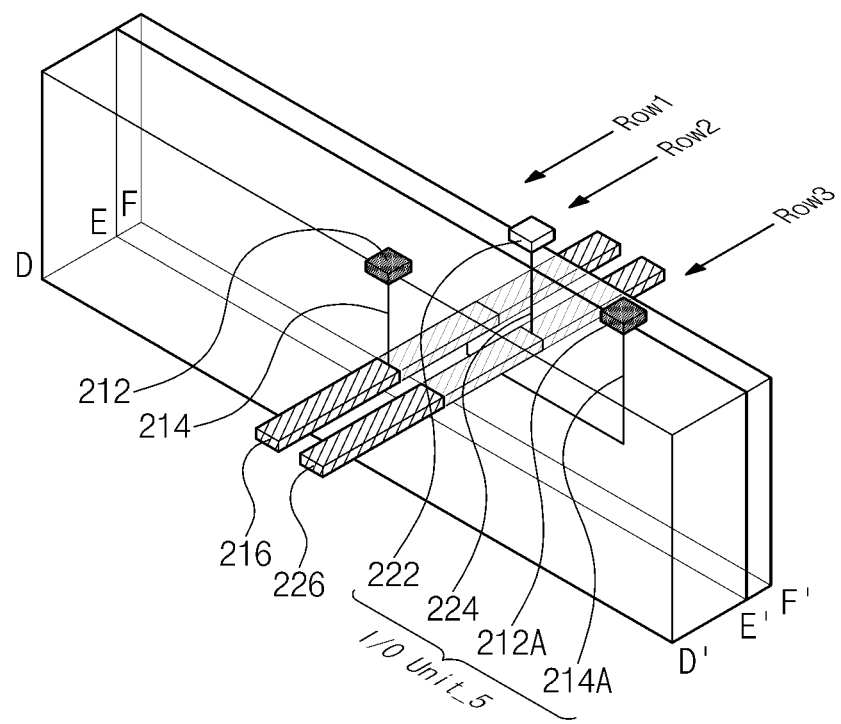
FIG. 11 is a drawing illustrating a part of FIG. 8 in three dimensions.

FIG. 11 is a drawing illustrating a part of FIG. 8 in three dimensions.

Referring to FIG. 11, the first pad 212 is disposed on the first row Row1 and the first conductive ring 216 is disposed inside the semiconductor chip 200 under the first pad 212. The first pad 212 is connected to the first conductive ring 216 to have a minimum distance therebetween through the first internal interconnection line 214. The first additional pad 212A is disposed on the third row Row3. The first additional pad 212A is connected to the first conductive ring 216 by a first additional internal interconnection line 214A having a "U" character shape. A shape of the first additional internal interconnection line 214A is not limited to the "U" character and the first additional internal interconnection line 214A may have various shapes.

The second pads 222 are disposed along the second row Row2 and the second conductive ring 226 is disposed inside the semiconductor chip 200 under the second pad 222. The second pad 222 and the second conductive ring 226 are connected to each other by the second internal interconnection line 224 to have a minimum distance therebetween.

Although not shown in FIG. 11, the third pads 232 may be disposed along the third row Row3 and the third pads 232 may be connected to a logical circuit (not illustrated) through the third internal interconnection lines 234.

As described above, the first pad 212 and the first additional pad 212A that are disposed on the first row Row1 and the third row Row3, respectively, are connected to the first conductive ring 216 and the second pad 222 disposed on the third row Row3 may be connected to the second conductive ring 216. The first conductive ring 216 and the second conductive ring 226 may be connected to an ESD circuit (not illustrated) disposed inside the semiconductor chip 200. The ESD circuit may be connected to the logical circuit disposed inside the semiconductor chip 200 to stably supply a power supply voltage to the logical circuit. The third pads 232 may be connected to the logical circuit disposed inside the semiconductor chip 200 through the third internal interconnection lines 234.

According to example embodiments, instead of providing a separate input/output unit to supply a ground voltage, the first additional pad 212A may be disposed in an input/output unit (e.g., I/O Unit_5) in which the second pad 222 to supply a power supply voltage is already disposed. That is, according to example embodiments, since a power supply voltage can be sufficiently supplied without providing a separate input/output unit for supplying a ground voltage, an SSN of a signal being input through the third pad 232 may be reduced. Additionally, a separate input/output unit is not included to supply a ground voltage and a power supply voltage, a chip size may be reduced.

Figure 12:
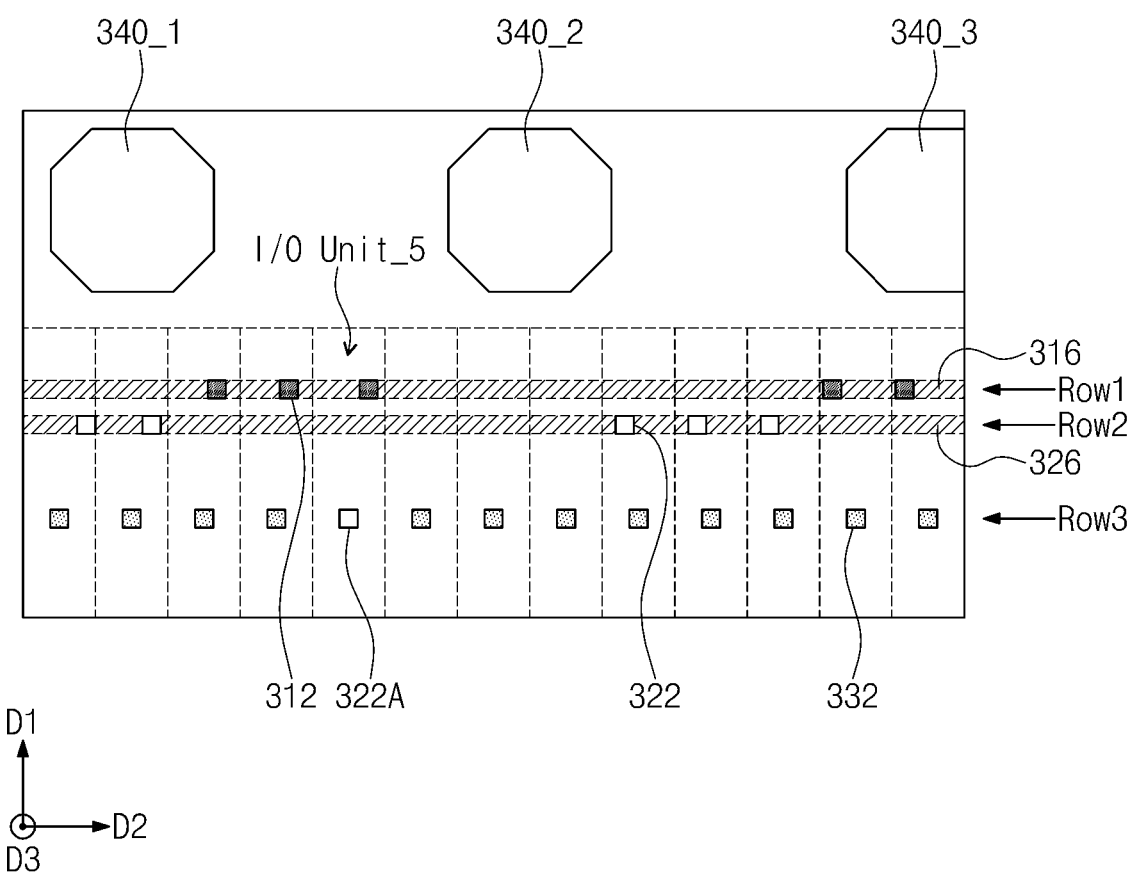
FIG. 12 is a drawing illustrating a part of a semiconductor chip in accordance with other example embodiments.

FIG. 12 is a drawing illustrating a part of a semiconductor chip in accordance with other example embodiments. As described above, a ground voltage is supplied through first pads 312, a power supply voltage is supplied through second pads 322 and signals may be provided through third pads 332. For brevity of description, conductive lines that connect bump areas 340_1, 340_2, 340_3 and the pads 312, 322, 332 are omitted. Conductive rings 316 and 326 being disposed inside the semiconductor chip are illustrated as an example.

Referring to FIG. 12, the semiconductor chip may include a plurality of input/output units (I/O units). Each of the input/output units may include at least one pad. For example, the fifth input/output unit (I/O unit_5) is illustrated to include one first pad 312 and one second pad 322A. An input/output unit including the third pad 332 through which a signal is input and/or output among the input/output units (I/O unit) may further include an input/output buffer (not illustrated) inside the underlying semiconductor chip.

The first pads 312 may be disposed along a first row Row1 parallel to a second direction D2. The second pads 322 may be disposed along a second row Row2 parallel to a second direction D2. Some of the second pads (or second additional pads 322A) may be disposed along a third row Row3 along which the third pads 332 are disposed. The third pads 332 may be disposed along the third row Row3 parallel to the second direction D2. However, the second additional pad 322A may not be disposed on the third row Row3 as long as the second additional pad 322A is disposed on a row different from the first row Row1 and the second row Row2.

A first conductive ring 316 may be disposed inside the semiconductor chip under the first row Row1. That is, the first conductive ring 316 may extend along the first row Row1. Although only a part of the first conductive ring 316 is illustrated, the first conductive ring 316 may be disposed to form a closed curve inside the semiconductor chip. The first conductive ring 316 may be connected to the first pad 312 through internal interconnection lines (not illustrated).

The second conductive ring 326 may be disposed inside the semiconductor chip under the second row Row2. That is, the second conducive ring 326 may extend along the second row Row2. Although only a part of the second conductive ring 326 is illustrated, the second conductive ring 326 may be disposed to form a closed curve inside the semiconductor chip. The second conductive ring 326 may be connected to the second pad 322 through internal interconnection lines (not illustrated).

According to the example embodiments, instead of providing a separate input/output unit to include pads receiving a power supply voltage, a pad that receives a power supply voltage may be disposed in an input/output unit in which a pad that receives a ground voltage is disposed. For example, referring to FIG. 12, the second additional pad 322A is disposed in the fifth input/output unit (I/O Unit_5) separately provided to receive a ground voltage. That is, instead of providing a separate input/output unit to receive a power supply voltage, the second additional pad 322A may be disposed inside the fifth input/output unit (I/O Unit_5) in which a pad that receives a ground voltage is disposed. An SSN of a signal being input through the third pad 332 may be reduced by disposing the first pad 312 and the second additional pad 322A in one input/output unit. Also, a size of the semiconductor chip may be reduced.

Figure 13:
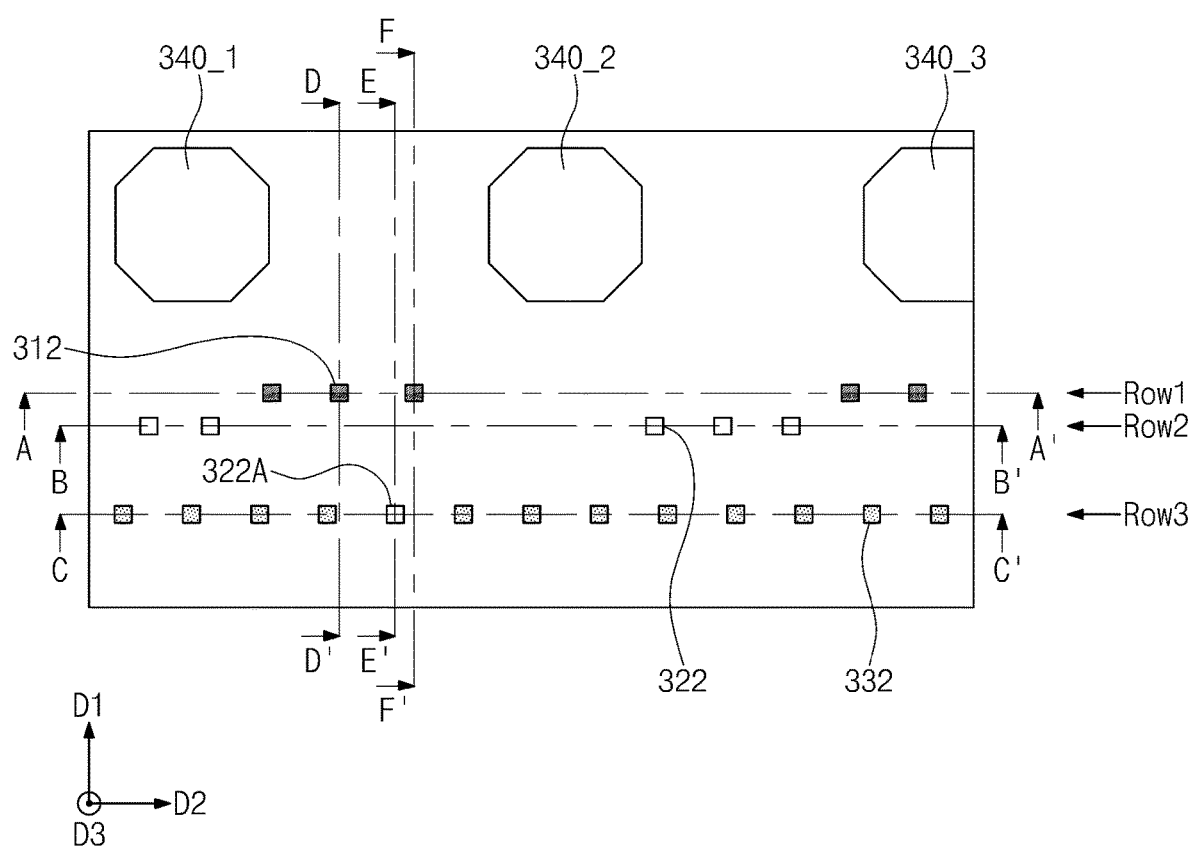
FIG. 13 is a top plan view illustrating a part of a semiconductor chip in accordance with example embodiments.
Figure 14A:
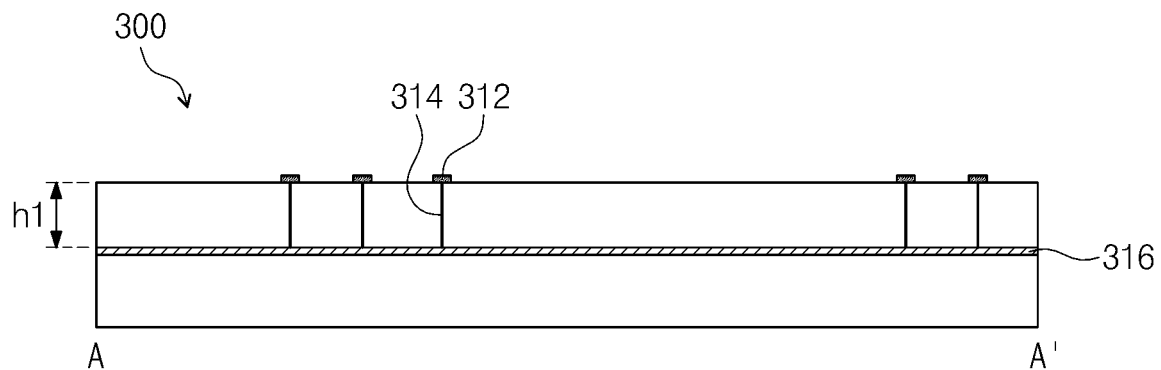
FIG. 14A is a cross-sectional view taken along the line A-A' of FIG. 13.
Figure 14B:
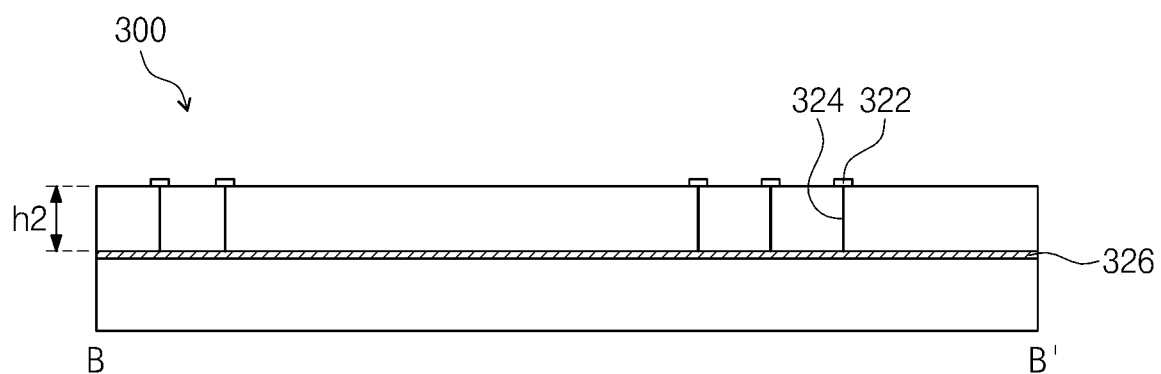
FIG. 14B is a cross-sectional view taken along the line B-B' of FIG. 13.
Figure 14C:
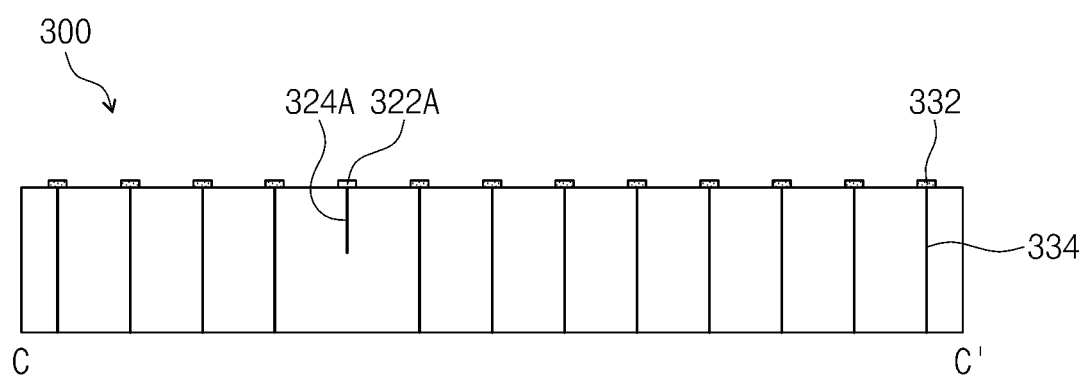
FIG. 14C is a cross-sectional view taken along the line C-C' of FIG. 13.
Figure 15A:
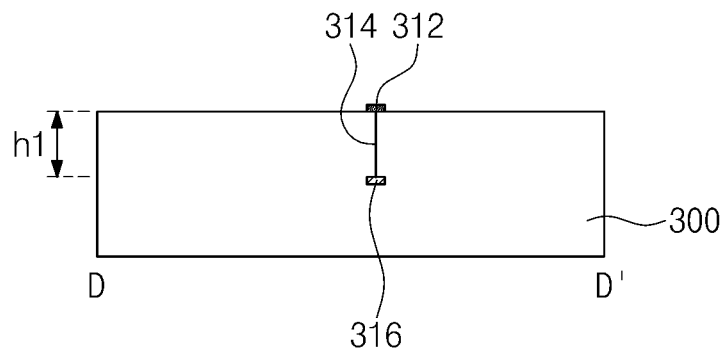
FIG. 15A is a cross-sectional view taken along the line D-D' of FIG. 13.
Figure 15B:
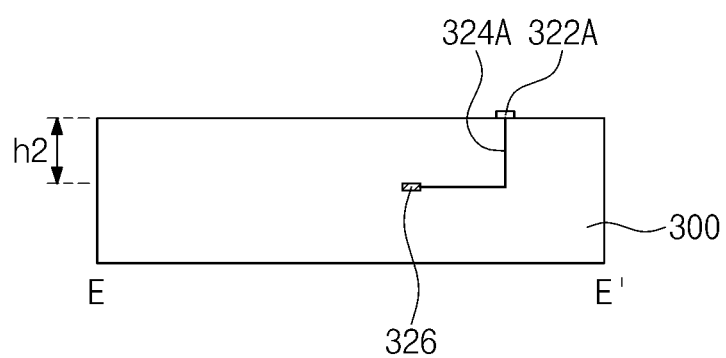
FIG. 15B is a cross-sectional view taken along the line E-E' of FIG. 13.
Figure 15C:
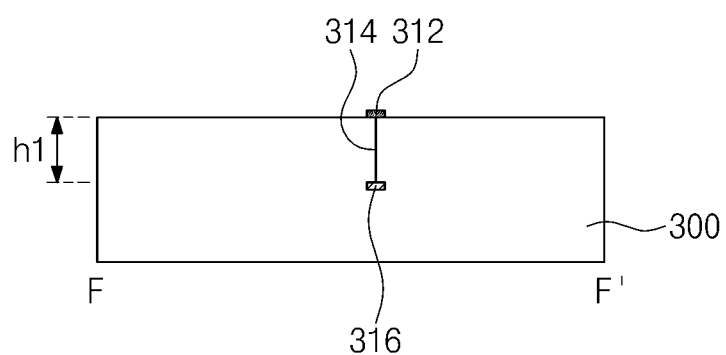
FIG. 15C is a cross-sectional view taken along the line F-F' of FIG. 13.

FIG. 13 is a top plan view illustrating a part of a semiconductor chip in accordance with example embodiments. FIG. 14A is a cross-sectional view taken along the line A-A' of FIG. 13. FIG. 14B is a cross-sectional view taken along the line B-B' of FIG. 13. FIG. 14C is a cross-sectional view taken along the line C-C' of FIG. 13. FIG. 15A is a cross-sectional view taken along the line D-D' of FIG. 13. FIG. 15B is a cross-sectional view taken along the line E-E' of FIG. 13. FIG. 15C is a cross-sectional view taken along the line F-F' of FIG. 13.

Referring to FIGS. 13 through 15C, first pads 312 may be disposed along a first row Row1. A first conductive ring 316 may be disposed inside a semiconductor chip 300 under the first pads 312. The first pads 312 may be connected to the first conductive ring 316 through first internal interconnection lines 314. The first conductive ring 316 may be disposed inside the semiconductor chip 300 at a depth of h1. As illustrated in FIG. 14A, the first pads 312 may be connected to the first conductive ring 316 to have a minimum distance therebetween. That is, each of the first pads 312 may be connected to the first conductive ring 316 to have a length of h1 therebetween.

Second pads 322 may be disposed along a second row Row2. A second conductive ring 326 may be disposed inside the semiconductor chip 300 under the second pads 322. The second pads 322 may be connected to the second conductive ring 326 through second internal interconnection lines 324. The second conductive ring 326 may be disposed inside the semiconductor chip 300 to a depth of h2. As illustrated in FIG. 14B, the second pads 322 may be connected to the second conductive ring 326 to have a minimum distance therebetween. That is, each of the second pads 322 may be connected to the second conductive ring 326 to have a length of h2 therebetween.

In this case, some of the second pads (or second additional pads 322A) may be disposed along a third row Row3. A second additional internal interconnection line 324A may connect the second additional pad 322A to the second conductive ring 326. As illustrated in FIG. 15B, the second additional internal interconnection line 324A may be disposed in the form of an "L" character.

Third pads 332 may be disposed along the third row Row3. Third internal interconnection lines (not illustrated) may connect the third pads 332 to a logical circuit (not illustrated) and a signal input through the third pads 332 may be transmitted to the logical circuit through the third internal interconnection lines.

Figure 16:
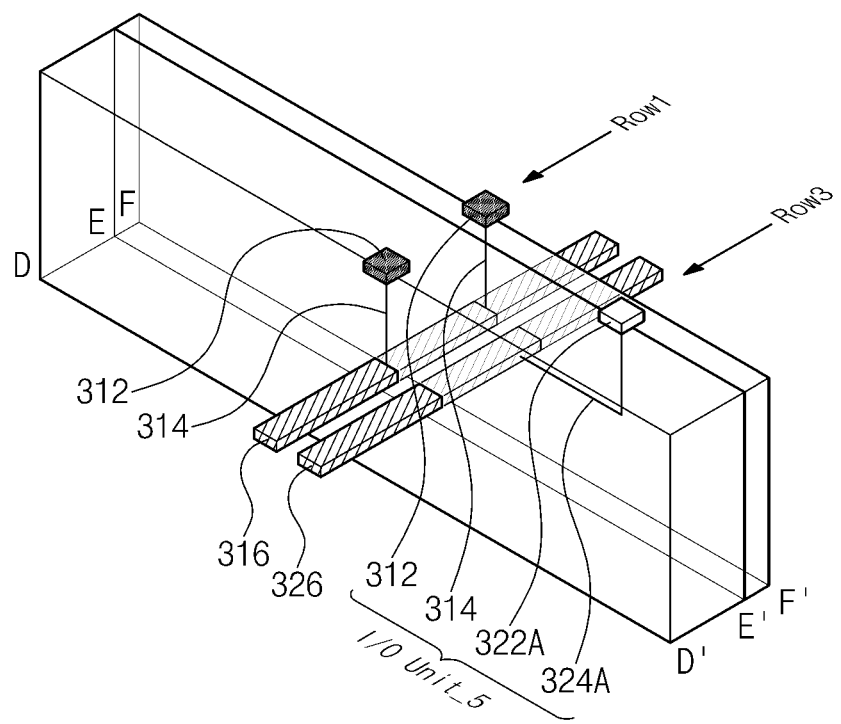
FIG. 16 is a drawing illustrating a part of FIG. 13 in three dimensions.

FIG. 16 is a drawing illustrating a part of FIG. 13 in three dimensions.

Referring to FIG. 16, the first pads 312 is disposed along the first row Row1 and the first conductive ring 316 is disposed inside the semiconductor chip 300 under the first pad 312. The first pad 312 is connected to the first conductive ring 316 to have a minimum distance therebetween through the first internal interconnection line 314.

Although not shown in FIG. 16, the second pads may be disposed along the second row and the second conductive ring may be disposed inside the semiconductor chip 300 under the second pad. The second pad and the second conductive ring may be connected to each other by the second internal interconnection line to have a minimum distance therebetween.

The second additional pad 322A is disposed on the third row Row3. The second additional pad 322A is connected to the second conductive ring 326 by a second additional internal interconnection line 324A having an "L" character shape. A shape of the second additional internal interconnection line 324A is not limited to the "L" character and the second additional internal interconnection line 324A may have various shapes.

Although not shown in FIG. 16, the third pads may be disposed along the third row Row3 and the third pads may be connected to a logical circuit (not illustrated) through the third internal interconnection lines.

The first pad 312 disposed on the first row Row1 is connected to the first conductive ring 316, and the second additional pad 322A disposed on the third row Row3 is connected to the second conductive ring 326. The first conductive ring 316 and the second conductive ring 326 may be connected to an ESD circuit (not illustrated) disposed inside the semiconductor chip 300. The ESD circuit may be connected to the logical circuit disposed inside the semiconductor chip 300 to stably supply a power supply voltage to the logical circuit. The third pads may be connected to the logical circuit disposed inside the semiconductor chip 300 by the third internal interconnection lines.

According to the example embodiments, instead of providing a separate input/output unit to supply a power supply voltage, the second additional pad 322A may be disposed in an input/output unit (e.g., I/O Unit_5) where the first pad 312 for supplying a ground voltage is disposed. That is, since a power supply voltage can be sufficiently supplied without providing a separate input/output unit for supplying a supply voltage, an SSN of a signal being input through the third pad 332 may be reduced. Additionally, since a separate input/output unit for supplying a ground voltage and a power supply voltage is omitted, a chip size may be reduced.

According to the example embodiments, a method of disposing pads of a semiconductor chip capable of stably supplying a power supply voltage may be provided.

According to the example embodiments, a method of disposing pads of a semiconductor chip capable of reducing a chip size may be provided.

Having described the exemplary embodiments, it is further noted that it is readily apparent to those of reasonable skill in the art that various modifications may be made without departing from the spirit and scope which is defined by the metes and bounds of the appended claims.

What is claimed is:

1. A semiconductor chip comprising:
a first bump area, a second bump area, a third bump area, and a fourth bump area that are provided on a surface of the semiconductor chip;
a first conductive line, a second conductive line, a third conductive line, and a fourth conductive line that are provided on the surface and are connected to the first bump area, the second bump area, the third bump area, and the fourth bump area, respectively; and
a first conductive ring and a second conductive ring that are provided inside the semiconductor chip,
wherein one end of the first conductive line and the first conductive ring are electrically connected to each other through a first internal interconnection line provided at a first row of the surface,
wherein one end of the second conductive line and the second conductive ring are electrically connected to each other through a second internal interconnection line provided at a second row of the surface,
wherein one end of the third conductive line and the first conductive ring are electrically connected to each other through a third internal interconnection line provided at a third row of the surface, and
wherein one end of the fourth conductive line and the second conductive ring are electrically connected to each other through a fourth internal interconnection line provided at the third row of the surface.

2. The semiconductor chip of claim 1, wherein a ground voltage is applied to the first and the third bump areas, and wherein a power supply voltage is applied to the second and the fourth bump areas.

3. The semiconductor chip of claim 1, further comprising:
a fifth bump area that is provided on the surface; and
a fifth conductive line that is provided on the surface and is connected to the fifth bump area,
wherein one end of the fifth conductive line is electrically connected to an input/output unit provided inside the semiconductor chip through a fifth internal interconnection line provided on the surface, and
wherein the one end of the fifth conductive line is provided at a row other than the first and the second rows.

4. The semiconductor chip of claim 3, wherein the row is the third row.

5. The semiconductor chip of claim 3, wherein a signal is received or transferred through the fifth bump area.

6. The semiconductor chip of claim 1, wherein the first internal interconnection line is provided to have a first minimum distance between the first conductive line and the first conductive ring, and
wherein the second internal interconnection line is provided to have a second minimum distance between the second conductive line and the second conductive ring.

7. The semiconductor chip of claim 6, wherein the third internal interconnection line is provided not to have the first minimum distance between the first conductive line and the first conductive ring, and
wherein the fourth internal interconnection line is provided not to have the second minimum distance between the fourth conductive line and the second conductive ring.

8. The semiconductor chip of claim 6, wherein the first minimum distance is same as the second minimum distance.

9. A semiconductor chip comprising:
a first bump area, a second bump area, a third bump area, and a fourth bump area that are provided on a surface of the semiconductor chip;
a first conductive line, a second conductive line, a third conductive line, and a fourth conductive line that are provided on the surface and are connected to the first bump area, the second bump area, the third bump area, and the fourth bump area, respectively;
a first internal interconnection line that is electrically connected to one end of the first conductive line extending vertical to a substrate;
a second internal interconnection line that is electrically connected to one end of the second conductive line extending vertical to the substrate;
a third internal interconnection line that is electrically connected to one end of the third conductive line extending vertical to the substrate; and
a fourth internal interconnection line that is electrically connected to one end of the fourth conductive line extending vertical to the substrate,
wherein the first and the third internal interconnection lines are electrically connected to each other, and
wherein the second and the fourth internal interconnection lines are electrically connected to each other.

10. The semiconductor chip of claim 9, further comprising:
a first conductive ring that is provided inside the semiconductor chip and is electrically connected to the first and the third conductive lines and the first and the third internal interconnection lines; and
a second conductive ring that is provided inside the semiconductor chip and is electrically connected to the second and the fourth conductive lines and the second and the fourth internal interconnection lines.

11. The semiconductor chip of claim 10, wherein a ground voltage is applied to the first and the third bump areas, and
wherein a power supply voltage is applied to the second and the fourth bump areas.

12. The semiconductor chip of claim 10, further comprising:
a fifth bump area that is provided on the surface;
a fifth conductive line that is provided on the surface and is connected to the fifth bump area; and
a fifth internal interconnection line that is electrically connected to one end of the fifth conductive line extending vertical to the substrate,
wherein the fifth internal interconnection line is electrically connected to an input/output unit provided inside the semiconductor chip.

13. The semiconductor chip of claim 12, wherein a signal is received or transferred through the fifth bump area.

14. The semiconductor chip of claim 10, wherein the first internal interconnection line is provided to have a first minimum distance between the first conductive line and the first conductive ring, and
wherein the second internal interconnection line is provided to have a second minimum distance between the second conductive line and the second conductive ring.

15. The semiconductor chip of claim 14, wherein the third internal interconnection line is provided not to have the first minimum distance between the first conductive line and the first conductive ring, and
wherein the fourth internal interconnection line is provided not to have the second minimum distance between the fourth conductive line and the second conductive ring.

16. A semiconductor chip comprising:
a plurality of input/output units;
a plurality of first conductive lines;
a second conductive line; and
a first conductive ring provided inside the semiconductor chip,
wherein each of the plurality of input/output units includes a first internal interconnection line connected to one end of a first conductive line, from among the plurality of first conductive lines,
wherein one ends of the plurality of first conductive lines are arranged at a first row on a surface of the semiconductor chip,
wherein at least one of the plurality of input/output units includes a second internal interconnection line that connects one end of the second conductive line and the first conductive ring each other, and
wherein a signal is input and/or output through at least one of the plurality of first conductive lines.

17. The semiconductor chip of claim 16, further comprising:
a third conductive line; and
a second conductive ring provided inside the semiconductor chip,
wherein the at least one of the plurality of input/output units includes a third internal interconnection line that connect one end of the third conductive line and the second conductive ring each other.

18. The semiconductor chip of claim 17, wherein a ground voltage is provided through the second conductive line, and
wherein a power supply voltage is provided through the third conductive line.

19. The semiconductor chip of claim 16, wherein the plurality of input/output units include input/output buffers, respectively, and
the input/output buffers are electrically connected to the plurality of first conductive lines, respectively.

20. The semiconductor chip of claim 17, wherein the one end of the second conductive line is arranged at a second row different from the first row and,
wherein the one end of the third conductive line is arranged at a third row different from the first row and the second row.

* * * * *